US011105014B2

(12) United States Patent
Gleissner et al.

(10) Patent No.: US 11,105,014 B2
(45) Date of Patent: Aug. 31, 2021

(54) DISTRIBUTION SYSTEM FOR CHEMICAL AND/OR ELECTROLYTIC SURFACE TREATMENT

(71) Applicant: Semsysco GmbH, Salzburg (AT)

(72) Inventors: Andreas Gleissner, Döbriach (AT); Franz Markut, St. Georgen (AT); Herbert Ötzlinger, Hallwang (AT)

(73) Assignee: SEMSYSCO GMBH, Salzburg (AT)

( * ) Notice: Subject to any disclaimer, the term of this patent is extended or adjusted under 35 U.S.C. 154(b) by 0 days.

(21) Appl. No.: 16/044,167

(22) Filed: Jul. 24, 2018

(65) Prior Publication Data

US 2019/0032240 A1    Jan. 31, 2019

(30) Foreign Application Priority Data

Jul. 27, 2017    (GB) ..................................... 1712068

(51) Int. Cl.
| | | |
|---|---|---|
| *C25B 15/08* | (2006.01) | |
| *C25D 21/12* | (2006.01) | |
| *C25D 17/00* | (2006.01) | |
| *C25D 7/12* | (2006.01) | |
| *C25F 3/12* | (2006.01) | |
| *C25F 3/30* | (2006.01) | |
| *H01L 21/288* | (2006.01) | |
| *H01L 21/3063* | (2006.01) | |

(52) U.S. Cl.
CPC ............... *C25D 21/12* (2013.01); *C25D 7/12* (2013.01); *C25D 17/001* (2013.01); *C25F 3/12* (2013.01); *C25F 3/30* (2013.01); *H01L 21/2885* (2013.01); *H01L 21/3063* (2013.01)

(58) Field of Classification Search
CPC .......... C25B 15/02; C25B 15/08; C25B 9/00; C25B 9/06
See application file for complete search history.

(56) References Cited

U.S. PATENT DOCUMENTS

2006/0049038 A1    3/2006    Griego et al.
2009/0272644 A1    11/2009   Lukkarila et al.

FOREIGN PATENT DOCUMENTS

| | | |
|---|---|---|
| CN | 105274605 A | 1/2016 |
| EP | 2746433 A1 | 6/2014 |
| EP | 3287549 A1 | 2/2018 |
| JP | 6393897 A | 4/1988 |

OTHER PUBLICATIONS

Examination Report dated Jan. 30, 2018 for GB1712068.4.
(Continued)

*Primary Examiner* — Zulmariam Mendez
(74) *Attorney, Agent, or Firm* — Hunton Andrews Kurth LLP

(57) ABSTRACT

An exemplary distribution system, apparatus and method can be provide for chemical and/or electrolytic surface treatment of a substrate in a process fluid. The distribution system can comprise a distribution body and a control unit. The distribution body can be configured to direct a flow of the process fluid and/or an electrical current to the substrate. The distribution body can comprise at least a first distribution element and a second distribution element. The control unit/device can be configured to control the first distribution element and the second distribution element separately from one another.

13 Claims, 5 Drawing Sheets

(56) References Cited

OTHER PUBLICATIONS

Combined Search and Examination Report under Sections 17 and 18(3) dated Jun. 28, 2018 for GB1809448.2.
Combined Search and Examination Report under Sections 17 and 18(3) dated Jan. 30, 2018 for GB1712068.4.
Extended European Search Report dated Dec. 17, 2018 for European Application No. 18183171.0.
Examination Report under Section 18(3) dated Mar. 26, 2021 for GB1712068.4.

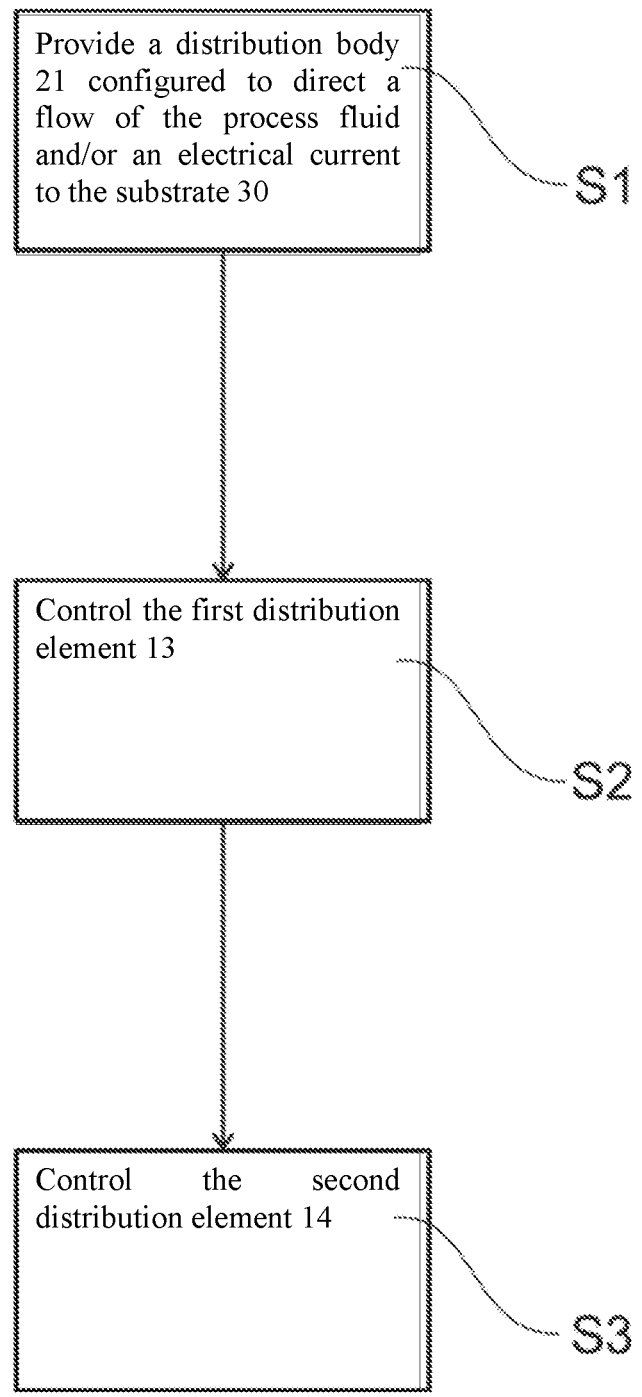

DISTRIBUTION SYSTEM FOR CHEMICAL AND/OR ELECTROLYTIC SURFACE TREATMENT

CROSS-REFERENCE TO RELATED APPLICATION(S)

This application claims the benefit and priority Great Britain Patent Application No. 1712068.4 filed on Jul. 27, 2017, the entire disclosure of which is incorporated herein by reference.

FIELD OF THE DISCLOSURE

The present disclosure relates to a distribution system for chemical and/or electrolytic surface treatment of a substrate in a process fluid, a device for chemical and/or electrolytic surface treatment of a substrate in a process fluid, and a distribution method for chemical and/or electrolytic surface treatment of a substrate in a process fluid.

BACKGROUND INFORMATION

In the semiconductor industry, various processes can be used to deposit or remove materials on or from the surface of wafers.

For example, electrochemical deposition (ECD) or electrochemical mechanical deposition (ECMD) processes can be used to deposit conductors, such as copper, on previously patterned wafer surfaces to fabricate device interconnect structures.

Chemical mechanical polishing (CMP) can be commonly used for a material removal step. Another technique, electropolishing or electroetching, can also be used to remove excess materials from the surface of the wafers.

Electrochemical (or electrochemical mechanical) deposition of materials on wafer surfaces or electrochemical (or electrochemical mechanical) removal of materials from the wafer surfaces are collectively called "electrochemical processing". Electrochemical, chemical and/or electrolytic surface treatment techniques may comprise electropolishing (or electroetching), electrochemical mechanical polishing (or electrochemical mechanical etching), electrochemical deposition and electrochemical mechanical deposition. All techniques utilize a process fluid.

Chemical and/or electrolytic surface treatment techniques can involve the following steps. A substrate to be processed is attached to a substrate holder, immersed into an electrolytic process fluid and serves as a cathode. An electrode can be immersed into the process fluid and serves as an anode. A direct current can be applied to the process fluid and dissociates positively charged metal ions at the anode. The ions can then migrate to the cathode, where they plate the substrate attached to the cathode.

One of the problems in such a process is the formation of a uniform layer. A plating current may not be uniform when passing from an anode to a cathode of the system and/or a fluid distribution in a process chamber may not be uniform. A uniform distribution of the current and/or the flow is implemented by a distribution body, which should correspond to the substrate to be treated. Non-uniform current or fluid distribution may lead to non-uniform layer thickness.

This problem may be handled by an exact adjustment of the entire system for chemical and/or electrolytic surface treatment to a specific substrate and in particular to a specific shape and/or size of the substrate. This, however, generates the problem that the surface treatment system has to be adapted each time the substrate is changed. This adaption of the surface treatment system mainly comprises an exchange of the distribution body, which should correspond to the substrate to be treated. The adaption may further comprise a replacement of the anode. As a result, the adjustment of the entire system for chemical and/or electrolytic surface treatment to a specific substrate consumes a lot of time and money.

Hence, there may be a need to provide an improved distribution system for chemical and/or electrolytic surface treatment of a substrate in a process fluid, which allows an easy adaption to different substrates.

SUMMARY OF EXEMPLARY EMBODIMENTS

At least such problem and other problems can be addressed by exemplary embodiments of the present disclosure. Exemplary embodiments of the present disclosure are certainly applicable to the distribution system for chemical and/or electrolytic surface treatment of a substrate in a process fluid, the device for chemical and/or electrolytic surface treatment of a substrate in a process fluid, and the distribution method for chemical and/or electrolytic surface treatment of a substrate in a process fluid.

To that end, according to an exemplary embodiment of the present disclosure, a distribution system for chemical and/or electrolytic surface treatment of a substrate in a process fluid can be provided. The exemplary distribution system can be or include a vertical distribution system with a vertical plating chamber, in which the substrate is inserted vertically. The exemplary distribution system can also be or include a horizontal distribution system with a horizontal plating chamber, in which the substrate is inserted horizontally.

The chemical and/or electrolytic surface treatment can be any material deposition, galvanized coating, chemical or electrochemical etching, anodal oxidation, metal separation or the like.

The substrate can comprise a conductor plate, a semiconductor substrate, a film substrate, an essentially plate-shaped, metal or metallized workpiece or the like. A surface of the surface to be treated can be at least partially masked or unmasked.

The distribution system for chemical and/or electrolytic surface treatment can comprise a distribution body and a control unit/device.

The distribution body can be configured to direct a flow of process fluid and/or electrical current to the substrate. The distribution body can correspond to the substrate to be treated in particular in view of its shape and size.

The distribution body can comprise at least a first distribution element and a second distribution element. The first distribution element and the second distribution element can be arranged or configured to direct a flow of process fluid and/or electrical current to different portions of the substrate.

The control unit/device can be configured to control the first distribution element and the second distribution element separately. The control unit can be or include a computer processor. The control unit/device can be configured to switch the second distribution element on or off separately and independently of the first distribution element to direct a flow of process fluid and/or electrical current to different portions of the substrate.

The system for chemical and/or electrolytic surface treatment according to exemplary embodiments of the present disclosure can facilitate an easy adaption of the exemplary system to different substrates and in particular to different shapes and/or sizes of the substrate. Such exemplary adaption can facilitate a reduction and/or even an elimination of the time required for adjusting the surface treatment system and, consequently facilitates a reduction and/or even an elimination of the costs for adjusting the surface treatment system. In such exemplary manner, it is no longer needed to exchange the distribution body, the anode, the process fluid supply and/or the like to different substrates. The surface treatment according to exemplary embodiments of the present disclosure can facilitate a formation of a uniform layer on the substrate independent of the shape and/or size of the substrate. In an example, the separate control of the first distribution element and the second distribution element can be configured for a uniform deposition rate. In one example, the separate control of the first distribution element and the second distribution element can be configured for a uniform surface treatment of the substrate.

According to certain exemplary embodiments of the present disclosure, the first distribution element can be configured for a surface treatment of a smaller substrate or for a surface treatment of an inner portion of a larger substrate. In one example, the first distribution element can correspond to an inner circle of the distribution body. In another example, the first distribution element can correspond to an inner rectangle of the distribution body.

The second distribution element can be configured to be switched off when treating a smaller substrate or to be switched on for treating an outer portion of a larger substrate. For example, the second distribution element can correspond to an outer element of the distribution body at least partially surrounding the first distribution element.

In particular, e.g., the first distribution element can be used for smaller substrates and a combination of the first distribution element and the second distribution element can be used for larger substrates. In case of a larger substrate, the first distribution element and the second distribution element can be switched on simultaneously or consecutively. In an example, the control unit can be configured to switch the first distribution element in a first power condition and the second distribution element into a second power condition different to the first power condition. The first distribution element and the second distribution element can be controlled to direct a flow of process fluid and/or electrical current to different portions of the substrate.

For example, the first distribution element can be a circle or a rectangle, and/or the second distribution element can be shaped to change the shape of the distribution body into the other of a circle or a rectangle.

The distribution body can have any type of shape. In one example, the distribution body can have a circular shape. In another example, the distribution body can have an angular shape. In further example, the distribution body can have rectangular, square, oval, or triangular, and/or another suitable geometric configuration(s).

For example, the distribution body further can comprise at least a third distribution element, and the control unit can be configured to control at least two of the first distribution element, the second distribution element and the third distribution element separately. The distribution body can also comprise more than two or three distribution elements, whereas at least two of such distribution elements can be configured to be controlled separately.

According to further exemplary embodiments of the present disclosure, a device can be provided for chemical and/or electrolytic surface treatment of a substrate in a process fluid is presented. The device for chemical and/or electrolytic surface treatment can comprise a distribution system for chemical and/or electrolytic surface treatment of a substrate in a process fluid as described herein and a substrate holder.

The substrate holder can be configured to hold the substrate. The substrate holder can be configured to hold one or two substrates (one substrate on each side of the substrate holder).

The exemplary device for chemical and/or electrolytic surface treatment can further comprise an anode. The exemplary device for chemical and/or electrolytic surface treatment can further comprise a power supply. The exemplary device for chemical and/or electrolytic surface treatment can further comprise a process fluid supply.

According to still further exemplary embodiments of the present disclosure, a distribution method can be provided for chemical and/or electrolytic surface treatment of a substrate in a process fluid is presented. The exemplary method for chemical and/or electrolytic surface treatment can comprise the following procedures/steps, which can be performed in the order below or in any other order:
  providing a distribution body configured to direct a flow of the process fluid and/or an electrical current to the substrate, whereas the distribution body can comprise at least a first distribution element and a second distribution element,
  a) controlling the first distribution element, and/or
  b) controlling the second distribution element, and/or
  c) whereas the controlling of the first distribution element and the second distribution element can be separate from each other.

For example, the first distribution element can be configured for a surface treatment of a smaller substrate or for a surface treatment of an inner portion of a larger substrate. The second distribution element can be configured to be switched off when treating a smaller substrate or to be switched on for treating an outer portion of a larger substrate. Indeed, the first distribution element can be used for smaller substrates and a combination of the first distribution element, and the second distribution element can be used for larger substrates. In case of a larger substrate, the first distribution element and the second distribution element can be switched on simultaneously or consecutively.

According to still further exemplary embodiments of the present disclosure, a method for chemical and/or electrolytic surface treatment can be provided, which can facilitate an easy adaption to different substrates and in particular to different shapes and/or sizes of the substrate. The easy adaption can facilitate a reduction and even an elimination of the time required for adjusting the surface treatment method and, consequently facilitating a reduction and even an elimination of the costs for adjusting the exemplary surface treatment method. The exemplary surface treatment method according to exemplary embodiments of the present disclosure can further facilitate a formation of a uniform layer on the substrate independent of the shape and/or size of the substrate.

The exemplary devices and methods according to the exemplary embodiments of the present disclosure can be suitable, in particular, for the processing of structured semiconductor substrates, conductor plates, and film substrates, and also for processing of the entire surface of planar metal and metallized substrates. The exemplary devices and methods according to the exemplary embodiments of the present disclosure can be may also be suitable for a production of large surface photoelectric panels for solar energy generation, or large-scale monitor panels.

For example, the exemplary system, the exemplary device, and the exemplary method for chemical and/or electrolytic surface treatment of a substrate in a process fluid according to the exemplary embodiments of the present disclosure can have similar and/or identical exemplary interchangeable feature. It shall be understood further that various embodiments herein can be used in any combination of the exemplary features and embodiments described herein.

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Further objects, features and advantages of the present disclosure will become apparent from the following detailed description taken in conjunction with the accompanying Figures showing illustrative embodiments of the present disclosure, in which:

FIG. 5 is a flow diagram of a distribution method for chemical and/or electrolytic surface treatment of a substrate in a process fluid according to an exemplary embodiment of the present disclosure.

Figure 1:
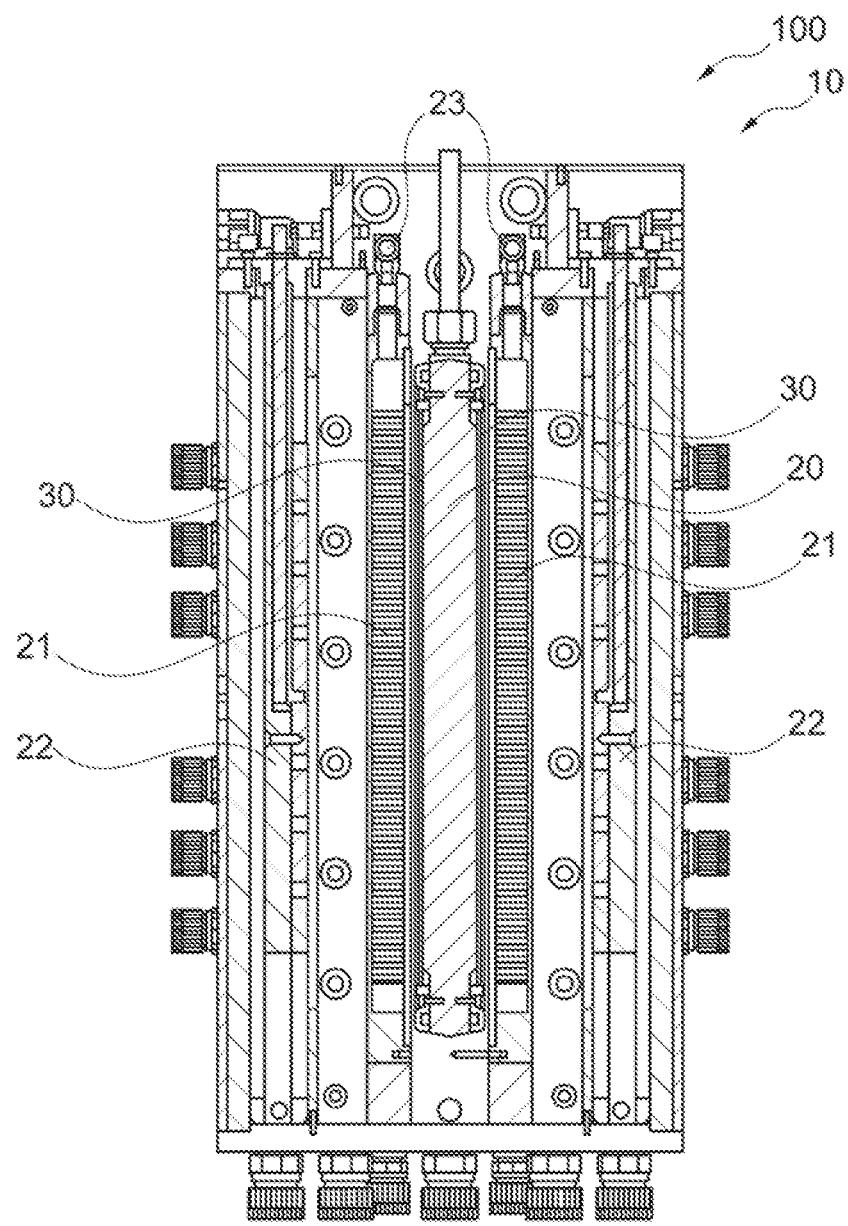
FIG. 1 is a cross-sectional view of a device for chemical and/or electrolytic surface treatment of a substrate in a process fluid according to an exemplary embodiment of the present disclosure.

Throughout the drawings, the same reference numerals and characters, unless otherwise stated, are used to denote like features, elements, components, or portions of the illustrated embodiments. The views in the drawings are merely schematic and are not to scale. Moreover, while the present disclosure will now be described in detail with reference to the figures, it is done so in connection with the illustrative embodiments and is not limited by the particular embodiments illustrated in the figures and the appended claims.

DETAILED DESCRIPTION OF EXEMPLARY EMBODIMENTS

FIG. 1 shows a cross-sectional view of a device 100 for chemical and/or electrolytic surface treatment of a substrate 30 in a process fluid according to an exemplary embodiment of the present disclosure. The exemplary device 100 for chemical and/or electrolytic surface treatment comprises a substrate holder 20 and a distribution system 10 for chemical and/or a electrolytic surface treatment of the substrate 30 in a process fluid.

Figure 2A:
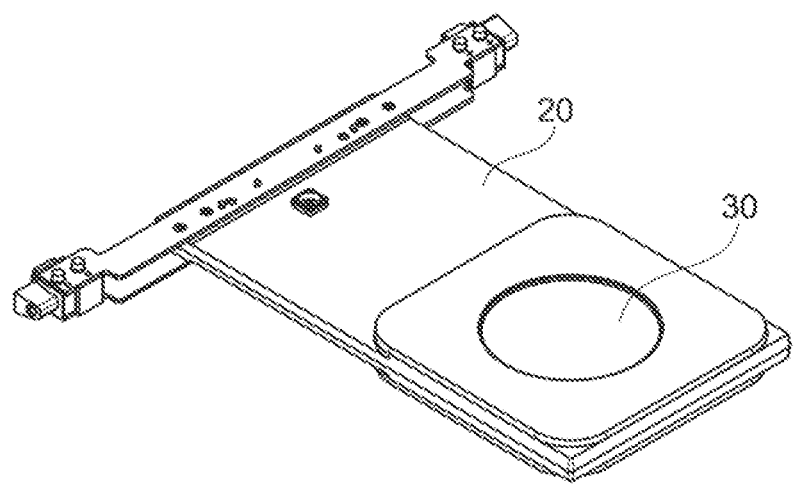
FIGS. 2a and 2b are perspective views of substrate holders holding two substrates according to an exemplary embodiment of the present disclosure.
Figure 2B:
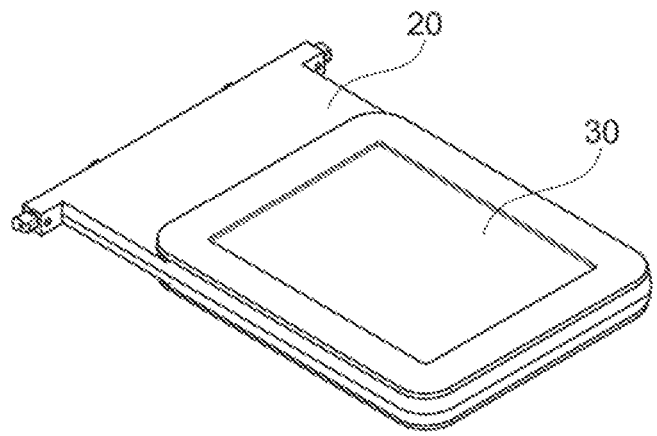

Details of exemplary substrate holders 20 are shown in FIGS. 2a and 2b. The exemplary substrate holders 20 can each be configured to hold substrates 30, e.g., vertically. Both substrate holders 20 can hold two substrates 30, e.g., one substrate 30 on each side of the substrate holder 20. The substrate holder 20 illustrated in FIG. 2a can hold circular substrates 30 with e.g. a diameter of 200 mm; the exemplary substrate holder 20 illustrated in FIG. 2b can hold rectangular substrates 30 with a size of e.g. 370×470 mm. These substrate holders 20 can facilitate the use of substrates of different shape and/or size without constructive modifications of the device 100 for chemical and/or electrolytic surface treatment.

For example, the exemplary device 100 for chemical and/or electrolytic surface treatment can also be used with a substrate holder 20, which can be configured to hold only one substrate 30 for single or dual side surface treatment in a preferably horizontal arrangement.

The exemplary distribution system 10 for chemical and/or electrolytic surface treatment of a substrate 30 in a process fluid, as shown in FIGS. 1 and 3, can produce targeted flow and current density patterns for a chemical and/or electrolytic surface treatment. The exemplary system 10 can comprise two distribution bodies 21 submerged in a process fluid (not shown). A substrate 30 can be provided opposite to each distribution body 21. Such substrate 30 can be attached to a substrate holder 20. The surface of the substrate 30 can be wetted by the process fluid. For example, two electrodes, such as, two anodes 22, can be present, each of which being located on a side of the distribution body 21 opposite of the substrate 30, and which are also bathed in the process fluid.

The distribution body 21 can have at least one inlet opening 23 for the process fluid and at least one liquid passage ending at an outlet nozzle array (not shown) at a front face of the distribution body 21. The pumped process fluid can flow through the outlet nozzles at a relatively high speed in the direction of the substrate 30 and carries out the desired chemical and/or electrolytic reaction at that location.

The distribution body 21 can advantageously consist of or include plastic, in particularly advantageous manner of polypropylene, polyvinyl chloride, polyethylene, acrylic glass, i.e. polymethyl methacrylate, polytetrafluoroethylene, or another material that will not be decomposed (e.g., for the most part) by the process fluid.

The substrate 30 can be an approximately or substantially a plate-shaped workpiece for the production of electric or electronic components, which can be mechanically fixed in a substrate holder 20, and the surface of which to be treated is bathed in the process fluid as the treatment medium coming from the distribution body 21. In an exemplary case, the substrate 30 can be a masked or unmasked conductor plate, a semi-conductor substrate, and/or a film substrate, or even any metal or metallized workpiece having an approximately planar surface.

The anode 22 can be attached in a rear region of the distribution body 21, in a mechanical contact with, or spatially separated from, the distribution body 21 such that the electric current flow can be carried out between the anode 22 and the substrate 30 acting as counter electrode within the process fluid. Depending on the surface treatment method used, the anode 22 can include a material that is insoluble in the process liquid, such as, e.g., platinizized titanium, or otherwise a soluble material, such as, for example, the metal to be galvanically separated.

Figure 3A:
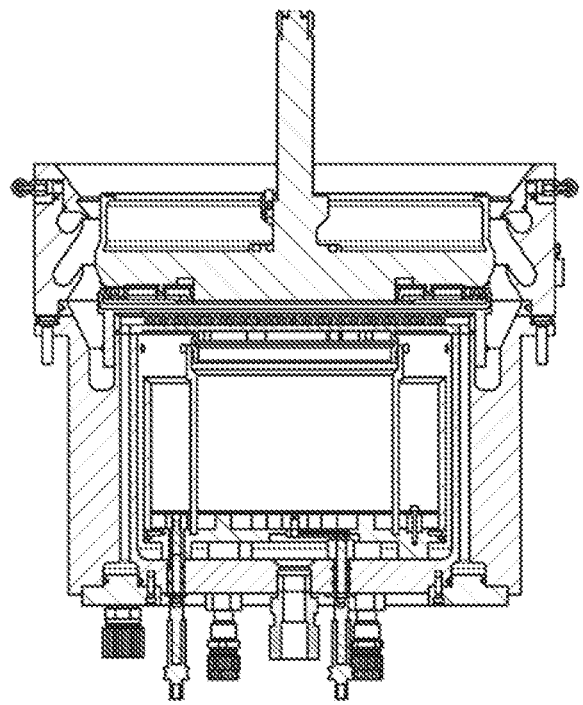
FIGS. 3a and 3b are diagrams of a device for chemical and/or electrolytic surface treatment and a distribution system for chemical and/or electrolytic surface treatment of a substrate in a process fluid according to according to exemplary embodiments of the present disclosure.
Figure 3B:
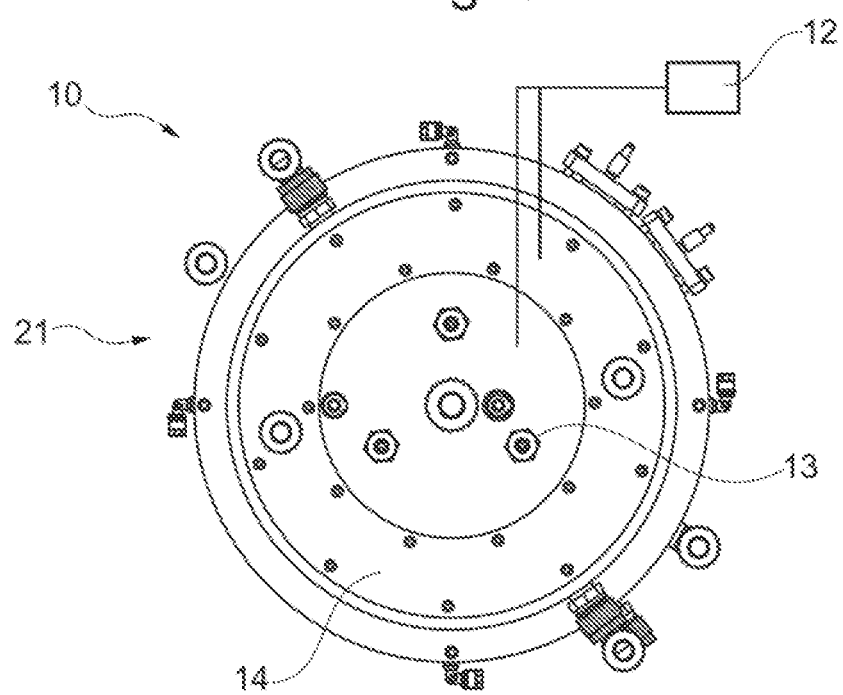

FIG. 3a shows a cross section of the device 100 for chemical and/or electrolytic surface treatment of a horizontally arranged substrate 30 in a process fluid according to an exemplary embodiment of the present disclosure. FIG. 3b shows a diagram of the distribution system 10 for chemical and/or electrolytic surface treatment of the substrate 30 (not shown in FIG. 3b) in a process fluid according to an exemplary embodiment of the present disclosure. The exemplary distribution system 10 for chemical and/or electrolytic surface treatment can comprise a distribution body 21 and a control unit/device 12.

The distribution body 21 can direct a flow of process fluid and/or electrical current to the substrate 30, and can correspond to the substrate 30 to be treated in particular in view of its shape and size. The exemplary distribution body 21 can comprise a first distribution element 13 and a second distribution element 14. The first distribution element 13 and the second distribution element 14 can be arranged to direct a flow of process fluid and/or electrical current to different portions of the substrate 30.

The control unit/device 12 can control the first distribution element 13 and/or the second distribution element 14 separately and independently from one another, and thus, the control unit/device 12 can, e.g., switch the second distribution element 14 on or off separately and independently from the first distribution element 13 to direct a flow of process fluid and/or electrical current to different portions of the substrate 30.

The first distribution element 13 can be configured for a surface treatment of a smaller substrate 30 or for a surface treatment of an inner portion of a larger substrate 30. The first distribution element 13 can correspond to an inner circle of the distribution body 21.

The second distribution element 14 can be configured to be switched off when treating a smaller substrate 30 or to be switched on for treating an outer portion of a larger substrate 30. The second distribution element 14 can correspond to an outer ring of the distribution body 21 surrounding the first distribution element 13.

As a result, the first distribution element 13 can be used for smaller substrates and a combination of the first distribution element 13, and the second distribution element 14 can be used for larger substrates. In case of a larger substrate, the first distribution element 13 and the second distribution element 14 can be switched on simultaneously or consecutively.

The exemplary distribution system 10 for chemical and/or electrolytic surface treatment according to the present disclosure thereby allows an easy adaption of the distribution system 10 to different substrates and in particular to different shapes and/or sizes of the substrate 30. This can facilitate a reduction and even an elimination of time and costs conventionally required for adjusting the surface treatment system by replacing components of the surface treatment system. The surface treatment according to an exemplary embodiment of the present disclosure can further facilitate a formation of a uniform layer on the substrate 30 independent of the shape and/or size of the substrate 30, because it can facilitate a uniform deposition rate and a uniform surface treatment of the substrate 30.

Figure 4A:
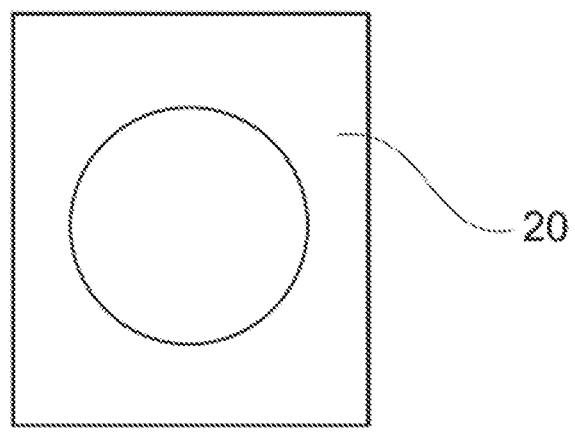
FIGS. 4a and 4b are views of substrate holders for a single substrate according to exemplary embodiments of the present disclosure.
Figure 4B:
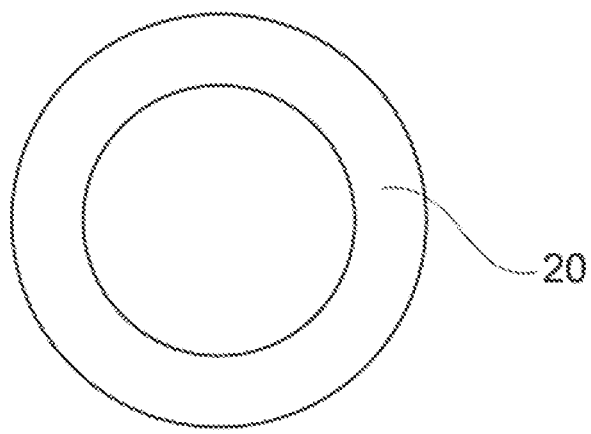

FIG. 4*a* shows a view of an exemplary substrate holder 20 for a single substrate to be horizontally arranged in a device 100 for chemical and/or electrolytic surface treatment. FIG. 4*b* shows a view of an exemplary holder 20 for a single substrate to be vertically arranged in a device 100 for chemical and/or electrolytic surface treatment.

FIG. 5 shows a flow diagram a distribution method for chemical and/or electrolytic surface treatment of a substrate 30 in a process fluid according to an exemplary embodiment of the present disclosure. The exemplary method for chemical and/or electrolytic surface treatment illustrated in FIG. 5 has the following procedures/step:

In a first step S1, providing a distribution body 21 configured to direct a flow of the process fluid and/or an electrical current to the substrate 30, wherein the distribution body 21 comprises at least a first distribution element 13 and a second distribution element 14.

In a second step/procedure S2, the first distribution element 13 is controlled.

In a third step/procedure S3, the second distribution element 14 is controlled.

The control of the first distribution element 13 and the second distribution element 14 can be separate from each other.

It has to be noted that embodiments of the present disclosure are described with reference to different subject matters. In particular, some embodiments are described with reference to method type claims whereas other exemplary embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. All features can be combined providing synergetic effects that are more than the simple summation of the features.

While the exemplary embodiments of the present disclosure have been illustrated and described in detail in the drawings and foregoing description, such illustrations and descriptions are to be considered illustrative or exemplary and not restrictive. The present disclosure is not limited to the disclosed embodiments. Other variations to the disclosed exemplary embodiments can be understood and effected by those skilled in the art in practicing the present disclosure provided herein, from a review of the drawings, the disclosure, and the claims.

In the claims, the word "comprising" does not exclude other elements or steps, and the indefinite article "a" or "an" does not exclude a plurality. A single computer processor or other unit may fulfil the functions of several items re-cited in the claims. The mere fact that certain measures are re-cited in mutually different dependent claims does not indicate that a combination of these measures cannot be used to advantage.

What is claimed is:

1. A distribution system for at least one of a chemical surface treatment or an electrolytic surface treatment of a substrate in a process fluid, comprising:
    a distribution body comprising a first distribution element and a second distribution element; and
    a control device configured to control the first distribution element and the second distribution element separately from one another,
    wherein the distribution body is configured to direct a flow of a process fluid so as to facilitate a switching of the second distribution element off separately and independently from the first distribution element,
    wherein the first distribution element corresponds to an inner circle or an inner rectangle of the distribution body, and
    wherein the second distribution element is shaped to change the shape of the distribution body into another one of the inner circle or the inner rectangle.

2. The distribution system according to claim 1, wherein the control device provide the separate control of the first distribution element and the second distribution element so as to provide an adaption of the distribution body to different substrates.

3. The distribution system according to claim 1, wherein the distribution body has a circular shape.

4. The distribution system according to claim 1, wherein the distribution body has an angular shape.

5. A distribution system for at least one of a chemical surface treatment or an electrolytic surface treatment of a substrate in a process fluid, comprising:
 a distribution body configured to direct at least one of (i) a flow of the process fluid or (ii) an electrical current to the substrate, the distribution body comprising a first distribution element and a second distribution element; and
 a control device configured to control the first distribution element and the second distribution element separately from one another, wherein the second distribution element corresponds to an outer element of the distribution body at least partially surrounding the first distribution element.

6. The distribution system according to claim 1, wherein the control device is configured to switch (i) the first distribution element into on a first power condition, and (ii) the second distribution element into a second power condition which is different from the first power condition.

7. The distribution system according to claim 1, wherein the control device provide the separate control of the first distribution element and the second distribution element so as to provide a uniform surface treatment of the substrate.

8. The distribution system according to claim 1, wherein the control device provide the separate control of the first distribution element and the second distribution element so as to provide a uniform deposition rate.

9. The distribution system according to claim 1, wherein the distribution body further comprises at least a third distribution element, and wherein the control device is configured to control at least two of the first distribution element, the second distribution element and the third distribution element separately from one another.

10. An apparatus for at least one of a chemical surface treatment or an electrolytic surface treatment of a substrate in a process fluid, comprising:
 a distribution system comprising:
  a distribution body configured comprising a first distribution element and a second distribution element, and
  a control device configured to control the first distribution element and the second distribution element separately from one another; and
 a substrate holder configured to hold the substrate,
 wherein the distribution body is configured to direct a flow of a process fluid so as to facilitate a switching of the second distribution element off separately and independently from the first distribution element,
 wherein the first distribution element corresponds to an inner circle or an inner rectangle of the distribution body, and
 wherein the second distribution element is shaped to change the shape of the distribution body into another one of the inner circle or the inner rectangle.

11. A distribution method for at least one of a chemical surface treatment or an electrolytic surface treatment of a substrate in a process fluid, comprising:
 providing a distribution body which comprises a first distribution element and a second distribution element;
 controlling the first distribution element; and
 controlling the second distribution element, wherein the first distribution element and the second distribution element are controlled separately from one another,
 wherein the distribution body is configured to direct a flow of a process fluid so as to facilitate a switching of the second distribution element off separately and independently from the first distribution element,
 wherein the first distribution element corresponds to an inner circle or an inner rectangle of the distribution body, and
 wherein the second distribution element is shaped to change the shape of the distribution body into another one of the inner circle or the inner rectangle.

12. A distribution system for at least one of a chemical surface treatment or an electrolytic surface treatment of a substrate in a process fluid, comprising:
 a distribution body configured to direct at least one of (i) a flow of the process fluid or (ii) an electrical current to the substrate, the distribution body comprising a first distribution element and a second distribution element; and
 a control device configured to control the first distribution element and the second distribution element separately from one another,
 wherein the first distribution element corresponds to an inner circle or an inner rectangle of the distribution body.

13. A distribution system for at least one of a chemical surface treatment or an electrolytic surface treatment of a substrate in a process fluid, comprising:
 a distribution body configured to direct at least one of (i) a flow of the process fluid or (ii) an electrical current to the substrate, the distribution body comprising a first distribution element and a second distribution element; and
 a control device configured to control the first distribution element and the second distribution element separately from one another,
 wherein the first distribution element is one of a circle or a rectangle,
 wherein the second distribution element is shaped to change the shape of the distribution body into another one of the circle or the rectangle, and
 wherein the second distribution element is shaped to change the shape of the distribution body into another one of the circle or the rectangle.

* * * * *